United States Patent
Hsu et al.

(10) Patent No.: US 8,791,571 B1
(45) Date of Patent: Jul. 29, 2014

(54) SYSTEM AND METHOD FOR PREVENTING ETCH ARCING DURING SEMICONDUCTOR PROCESSING

(71) Applicant: Taiwan Semiconductor Manufacturing Company, Ltd., Hsin-Chu (TW)

(72) Inventors: Hung-Wen Hsu, Tainan (TW); Tung-Ting Wu, Taipei (TW); Jiech-Fun Lu, Tainan County (TW); Yeur-Luen Tu, Taichung (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/802,732

(22) Filed: Mar. 14, 2013

(51) Int. Cl.
*H01L 23/48* (2006.01)
*H01L 23/52* (2006.01)
*H01L 29/40* (2006.01)

(52) U.S. Cl.
USPC .......................................... 257/758; 257/211

(58) Field of Classification Search
USPC ................................................ 257/758, 211
See application file for complete search history.

(56) References Cited

U.S. PATENT DOCUMENTS

| | | | | |
|---|---|---|---|---|
| 7,781,249 B2 * | 8/2010 | Laming et al. | .................. | 438/51 |
| 7,816,666 B2 * | 10/2010 | Koo et al. | ......................... | 257/40 |
| 2006/0108653 A1 * | 5/2006 | Koo et al. | ...................... | 257/420 |
| 2009/0071603 A1 * | 3/2009 | Koo et al. | ...................... | 156/277 |
| 2012/0261781 A1 | 10/2012 | Hsu et al. | | |
| 2013/0108084 A1 * | 5/2013 | Zhang | ........................... | 381/174 |

* cited by examiner

*Primary Examiner* — Telly Green
(74) *Attorney, Agent, or Firm* — Haynes and Boone, LLP

(57) ABSTRACT

A method for preventing arcing during processing of a back side of a semiconductor wafer is provided herein. The method comprising includes steps of depositing a dielectric layer over the back side and depositing an anti-arcing layer over the dielectric layer. The anti-arcing layer is a conductive layer, but it not suitable for conducting signals or power. The method further includes etching an opening through a plurality of material layers of the semiconductor wafer. The opening exposes a conductive layer located on a front side of the semiconductor wafer. Additionally, the method includes depositing a conductive layer in the opening to form a through-wafer interconnect. A semiconductor wafer fabricated according to the method is also disclosed.

19 Claims, 5 Drawing Sheets

SYSTEM AND METHOD FOR PREVENTING ETCH ARCING DURING SEMICONDUCTOR PROCESSING

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased. Additionally, various packaging techniques have been developed to decrease the size of packaged semiconductors.

Among the techniques that have been developed is back-side processing, such as is used in the production of back-side image sensors. Among other benefits, back-side processing allows electrical connectivity between both a front and a back side of a semiconductor wafer. However, certain problems can arise during back-side processing, such as arcing. Therefore, while current back-side processing techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

Figure 1A:
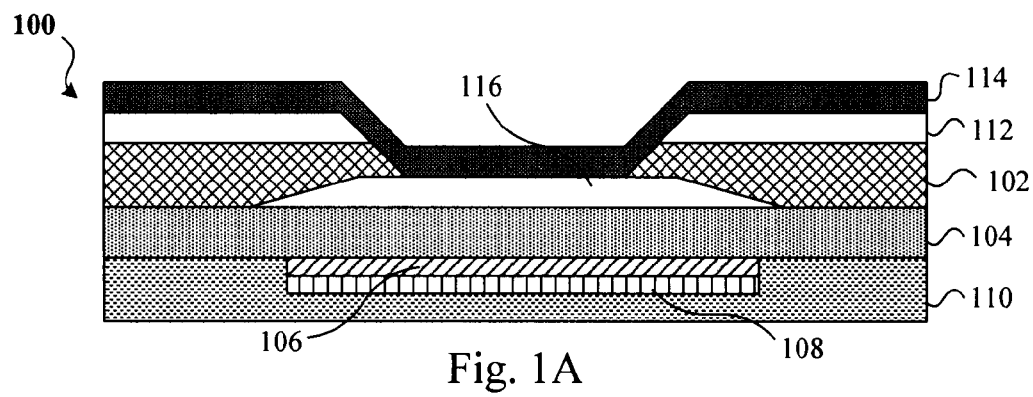
FIGS. 1A, 1B, 1C, 1D, and 1E are cross-sectional diagrams of a semiconductor wafer undergoing processing during back-side pad formation.

The various features disclosed in the drawings briefly described above will become more apparent to one of skill in the art upon reading the detailed description below. Where features depicted in the various figures are common between two or more figures, the same identifying numerals have been used for clarity of description. However, this should not be understood as limiting such features.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A, 1B, 1C, 1D, and 1E are fragmentary, cross-sectional diagrams of an integrated circuit wafer 100 having undergone and undergoing a number of processes or processing steps during back-side pad formation. As depicted in FIG. 1A, wafer 100 includes a substrate 102. As depicted, the substrate 102 is a semiconductor substrate including silicon. Alternatively or additionally, the substrate 102 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 102 may be a semiconductor on insulator (SOI). The substrate 102 may include a doped epitaxial layer, a gradient semiconductor layer, and/or a semiconductor layer overlying another semiconductor layer of a different type, such as a silicon layer on a silicon germanium layer. The substrate 102 may be a p-type or an n-type substrate depending on design requirements of the integrated circuit wafer 100.

The substrate 102 has a front side and a back side. The front side supports the formation of circuit elements, such as transistors, resistors, capacitors, and diodes, as well as electrical contacts for these elements. On the front side of the substrate 102 is a first inter-layer dielectric (ILD) layer 104. Over this first ILD layer 104 is a conductive feature including two material layers: a first conductive layer 106 and a second conductive layer 108. The conductive layers 106 and 108 form part of the electrical control and power system present on the front side of the substrate 102. In some embodiments, only a single conductive layer 106 is used, while in the depicted embodiment the first conductive layer 106 may also serve to promote the adhesion of the conductive layer 108. Conductive layers 106 and 108 may be formed of metal, doped polysilicon, or another conductor. The conductive layers 106 and 108 may be formed by many processes including physical vapor deposition (PVD), chemical vapor deposition (CVD), or combinations thereof. Other manufacturing techniques to form the conductive layers 106 and 108 may include photolithographic processing and etching to pattern conductive material layers.

As depicted, a second ILD layer 110 is deposited over the patterned conductive layers 106 and 108. The first and second ILD layers 104 and 110 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond®

(Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, or combinations thereof. In some embodiments, one or both of the ILD layers 104 and 110 have a multilayer structure. The ILD layers 104 and 110 may be formed by a technique such as spin-on coating, CVD, sputtering, or another suitable process.

On the backside of the IC wafer 100 is a plurality of additional material layers. As depicted, a barrier layer 112 is deposited over the back side of substrate 102. In the depicted embodiment, barrier layer 112 is a silicon nitride layer. Over the barrier layer 112 is a dielectric layer 114, which in the depicted embodiment is a silicon dioxide layer. As depicted, an etch process has been performed prior to deposition of the dielectric layer 114 to create an opening in the barrier layer 112 and in the substrate 102. This opening is formed such that a portion of the dielectric layer 114 is in contact with a shallow trench isolation (STI) structure 116 that is formed in substrate 102 from the front side of the substrate 102.

Figure 1B:
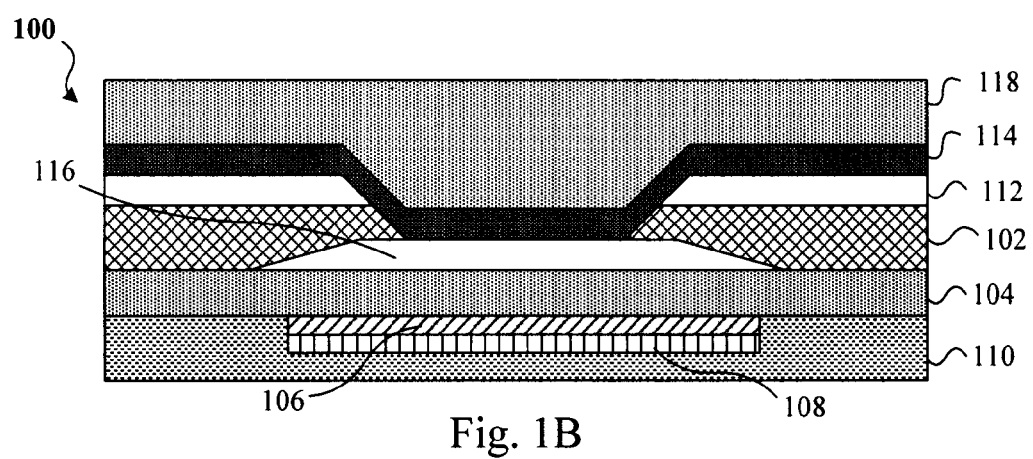
Figure 1C:
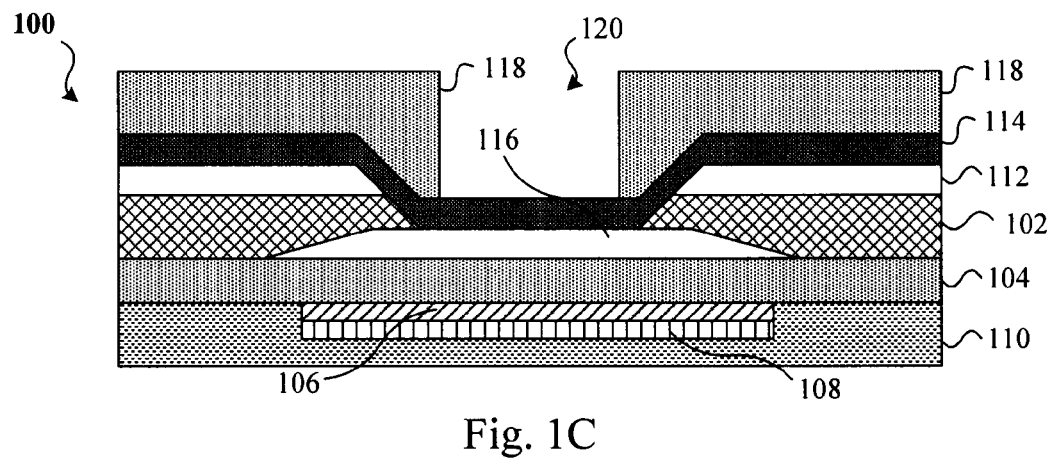

In FIG. 1B, a photoresist layer 118 is deposited over the surface of the dielectric layer 114. The photoresist layer 118 may be a positive photoresist or a negative photoresist. It may be spin-coated onto dielectric layer 114 and then subjected to a soft baking process. After a photolithographic mask is aligned and the photoresist layer 118 exposed to photolithographic radiation, the photoresist layer 118 is developed to form an opening with which to pattern at least one underlying layer, such as the dielectric layer 114. The opening 120 is depicted in FIG. 1C.

Figure 1D:
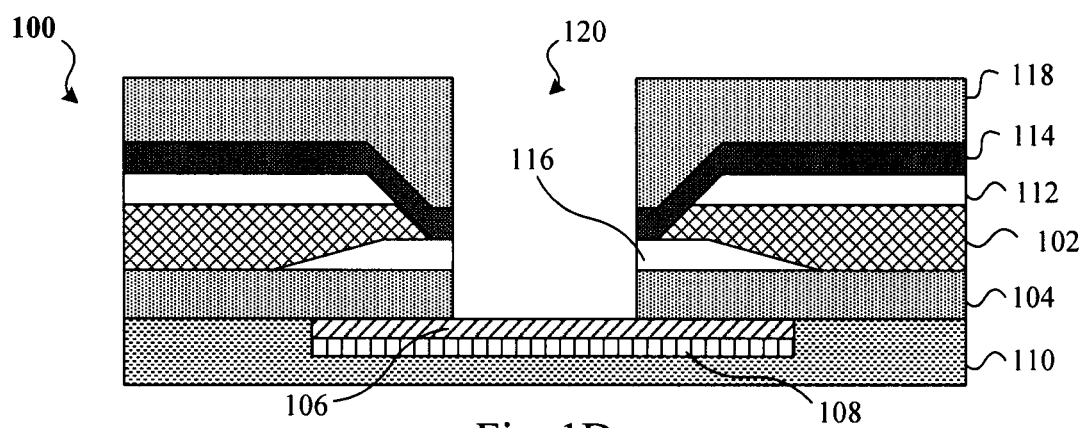

FIG. 1D depicts the results of an etch process which used the patterned photoresist layer 118 as an etch mask. As depicted, the etch process is a dry etch process, such as a plasma etch. The etch process has etched an opening, or extended the opening 120, through the dielectric layer 114, the STI structure 116, and the first ILD layer 104 to expose a portion of the conductive layer 106 located on the front side of the substrate 102. Thus, the etch process forms an opening that allows access from the back side of the substrate 102 to some features on the front side of the substrate 102.

Figure 1E:
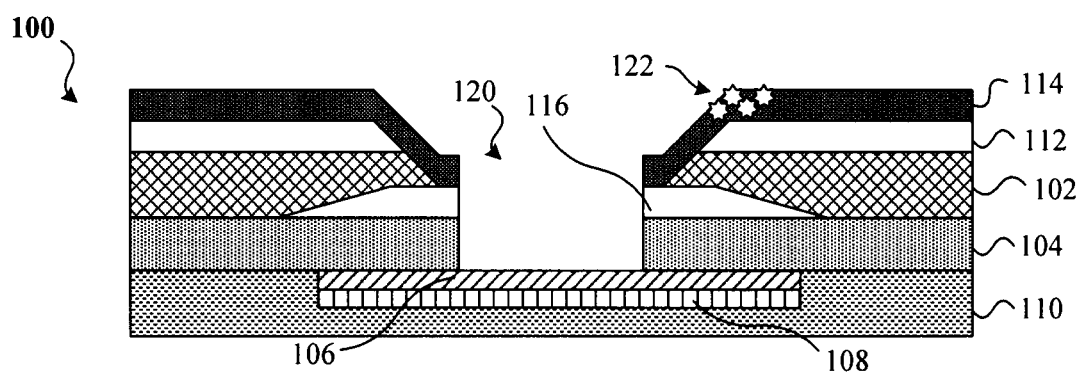

In FIG. 1E, the remaining portions of photoresist layer 118 that served as an etch mask have been removed from the surface of the dielectric layer 114. After the removal of the photoresist layer 118, a plurality of defects is present in the dielectric layer. In FIG. 1E, these defects are arcing defects 122. The arcing defects 122, which may be caused by the accumulation of electrons in the certain areas of the dielectric layer 114, decrease the yield of usable die obtained from the wafer 100.

FIGS. 2A, 2B, 2C, 2D, 2E, 2F, and 2G are fragmentary, cross-sectional diagrams of an integrated circuit wafer 200 having undergone and undergoing a number of processes or processing steps during back-side processing. As depicted, the wafer 200 is a wafer of back side illuminated image sensors, but other embodiments may not be image sensors. The wafer 200 shares many of the features described above in connection with the IC wafer 100 of FIGS. 1A, 1B, 1C, 1D, and 1E. For instance, wafer 200 includes a substrate 102 with a front side and a back side, both sides having a plurality of material layers thereon. The plurality of material layers includes a first ILD layer 104 with a first conductive layer 106 and a second conductive layer 108 thereon. And a second ILD layer 110 covers the conductive layers 106 and 108.

On the back side of the substrate 102 there is a barrier layer 112, and a dielectric layer 114. There is an opening present in the barrier layer 112 such that part of the dielectric layer is in contact with the substrate 102. Additionally, there is an opening in the substrate 102 such that the dielectric layer 114 is also in contact with an STI structure 116 that is formed in the front side of substrate 102 and extends partway therethrough. In some embodiments, the opening that allows the dielectric layer 114 to contact the STI structure is not present. The materials from which these layers are formed in some embodiments may be substantially similar to those included above in the discussion of IC wafer 100 of FIGS. 1A, 1B, 1C, 1D, and 1E.

Unlike in the wafer 100 of FIGS. 1A, 1B, 1C, 1D, and 1E, wafer 200 further includes an anti-arcing layer 202 deposited over the dielectric layer 114 on the back side of wafer 200. The anti-arcing layer 202 is made from a conductive material in order to provide a generally uniform potential surface across the wafer 200. In the depicted embodiment, anti-arcing layer 202 is a tantalum metal layer. Other embodiments may be made from tantalum nitride, aluminum, aluminum copper alloy, copper, titanium, titanium nitride, tungsten, polysilicon, metal silicide, or combinations thereof. Some embodiments are formed from a conductive polysilicon layer. In the depicted embodiment, the tantalum of anti-arcing layer 202 is deposited by a CVD process and is about 600 angstroms thick. In other embodiments, another process, such as atomic layer deposition, sputtering, PVD, or others may be used. Additionally, the thickness of the anti-arcing layer 202 may be thicker or thinner in other embodiments. For example, the thickness of the anti-arcing layer 202 may be less than 600 angstroms in some embodiments. In the depicted embodiment of wafer 200, the anti-arcing layer 202 is thinner than other conductive layers used in wafer 200. This is in part because the anti-arcing layer 202 does not need to be able to supply power or to conduct signals. So in some embodiments like the one depicted, the anti-arcing layer 202 is not an electrically functional layer.

Figure 2A:
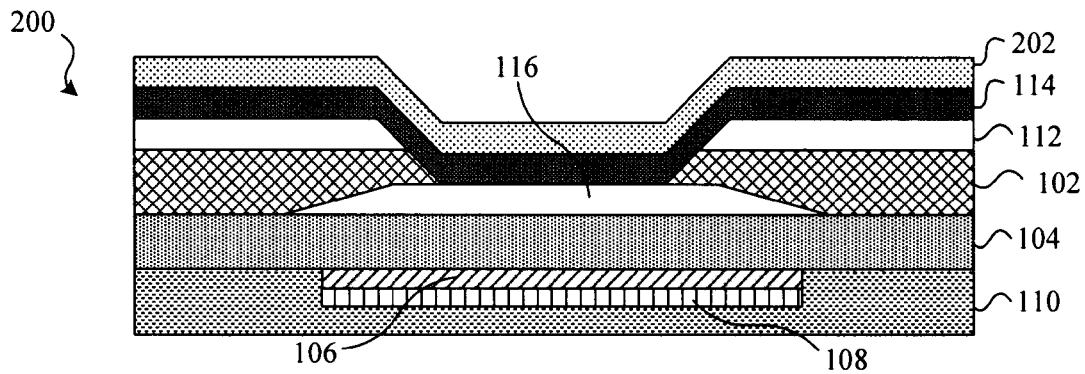
FIGS. 2A, 2B, 2C, 2D, 2E, 2F, and 2G are cross-sectional diagrams of a semiconductor wafer undergoing processes during back-side pad formation according to an embodiment of the present disclosure.
Figure 2B:
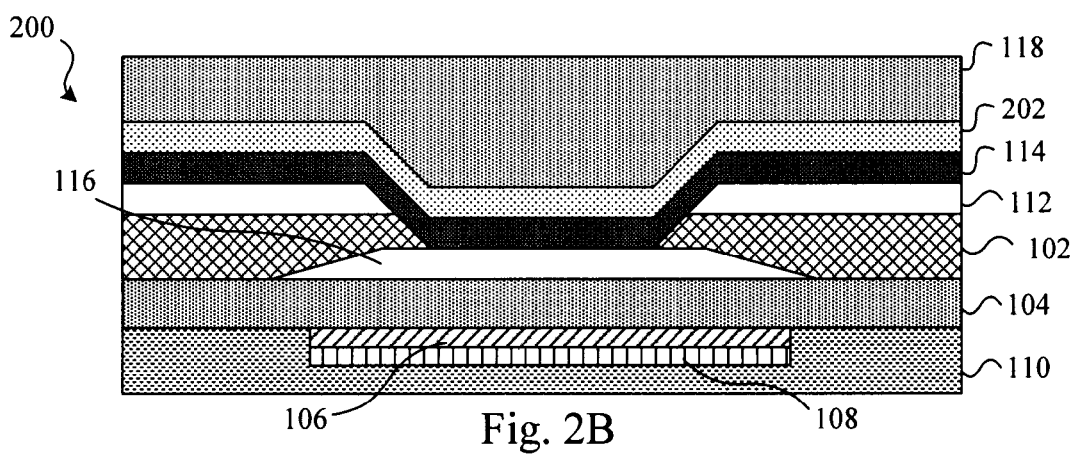
Figure 2C:
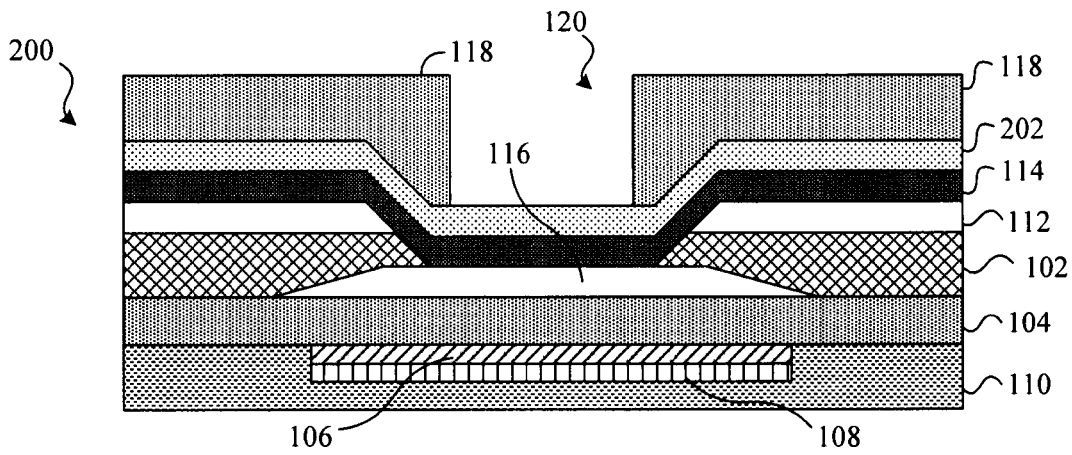

FIG. 2B depicts a photoresist layer 118 overlaying the anti-arcing layer 202 as part of a photolithographic process. Thus, the photoresist layer 118 is exposed in certain areas to provide one or more openings in order to pattern one or more underlying layers. FIG. 2C depicts a result of a photolithographic step that has removed the portion of the photoresist layer 118 as depicted. An opening 120 provides a window by which further processes may be used to pattern the layers situated below the photoresist layer 118, including the anti-arcing layer 202, which is exposed by the opening 120 in the photoresist layer 118.

Figure 2D:
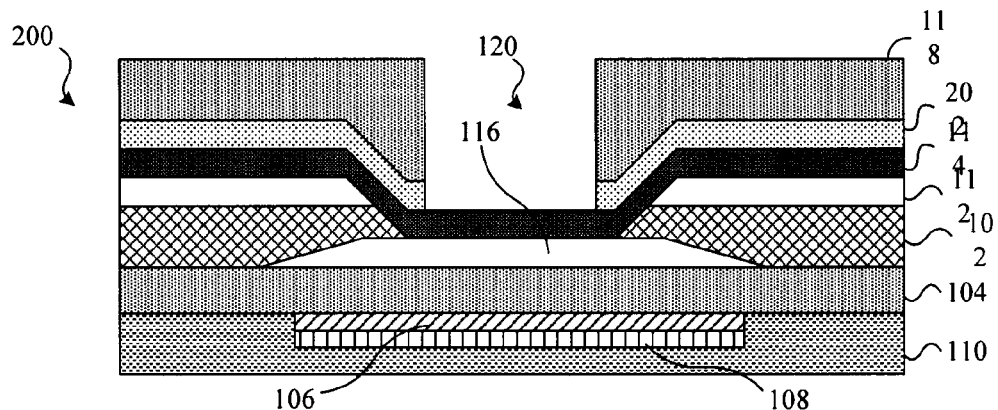

In FIG. 2D, the back side of wafer 200 is exposed to an etch process that removes the exposed portion of the anti-arcing layer 202. This etch process can be a wet or a dry etch process. In the depicted embodiment, a Cl-based dry etch process is used to remove the exposed portion of the anti-arcing layer 202, thereby extending the opening 120. In other embodiments, $BCl_3$ or other etchant may be used. The particular etchant used in a given embodiment may be determined by the particular conductive material used to form the anti-arcing layer 202.

Figure 2E:
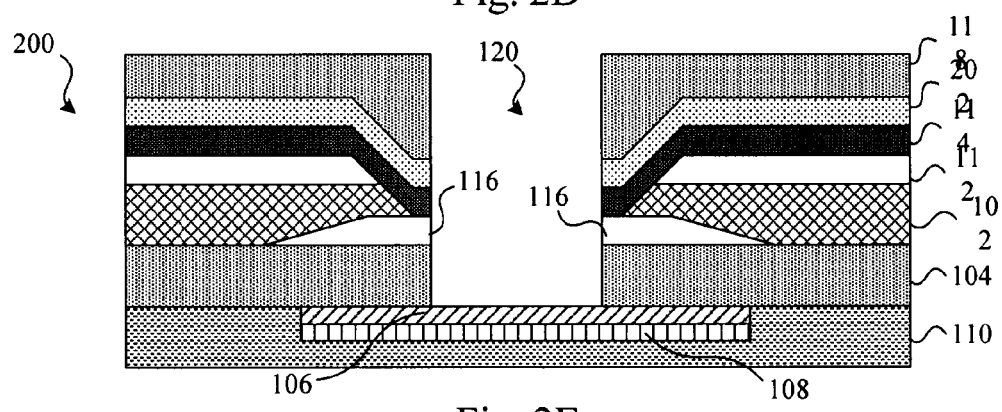

FIG. 2E depicts the result of an additional etch process. This additional etch process, which uses the patterned photoresist layer 118 as its mask, removes the exposed portion of the dielectric layer 114, the then-exposed portion of the STI structure 116, and the then-exposed portion of the first ILD layer 104. The additional etch process further extends the opening 120, shaped by the opening in the photoresist layer 118, that permits contact to an underside of the then exposed first conductive layer 106. In subsequent processing steps, an electrical conductor is deposited into the opening 120 created in the dielectric layer 114, the STI structure 116, and the ILD layer 104 in order to supply power or control signals formed on the front side of wafer 200. The additional etch process may be a dry etch or a wet etch. In the depicted embodiment, a $CF_4$-based dry etch is used. In another embodiment, $C_4F_8$ is used, while other etchants and combinations of etchants may be used in further embodiments.

As depicted, in FIGS. 2D and 2E, a single photoresist layer 118 is used to pattern the anti-arcing layer 202 as well as the underlying insulting layers (i.e. dielectric layer 114, the STI structure 116, and the first ILD layer 104). However, in some embodiments, one photoresist layer is used to pattern the anti-arcing layer 202, and a second photoresist layer is used to pattern the underlying insulating layers. Further, in such embodiments, the opening formed in the one photoresist layer may be different from the opening formed in the second photoresist layer. In yet other embodiments, masking layers such as oxide or oxynitride layers may be used instead of or in addition to a photoresist layer or layers in order to provide the opening 120 in the anti-arcing layer 202, the dielectric layer 114, the STI structure 116, and the ILD layer 104. The opening 120 is used in the depicted embodiment to permit a through-wafer interconnect to be formed that can electrically connect features on the front side of the wafer 200 to features on the back side thereof.

Figure 2F:
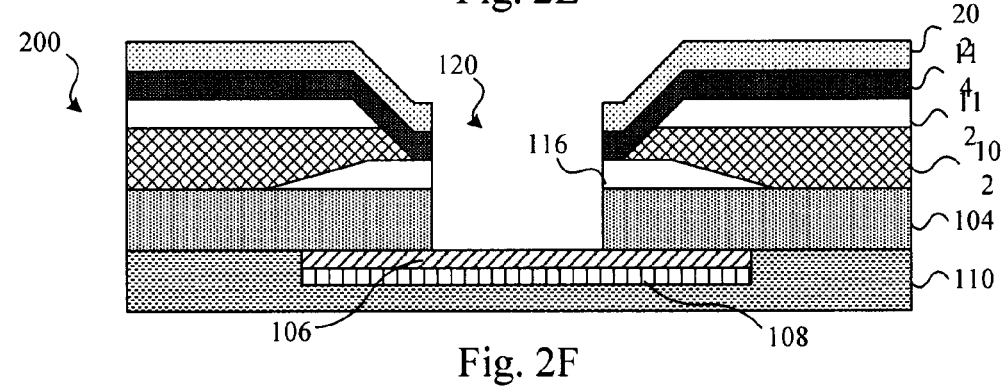
Figure 2G:
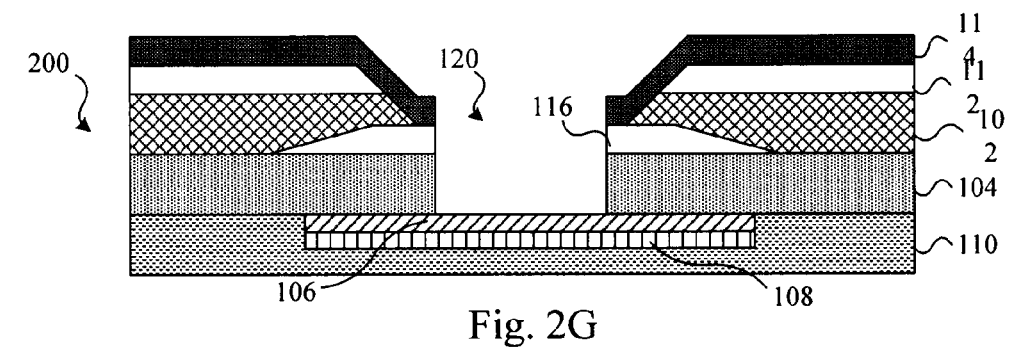

In FIG. 2F, the photoresist layer 118 that was used as an etch mask is removed. In contrast to the wafer 100 in FIG. 1E with its arcing defects 122, no such defects are depicted in FIG. 2F. The uniform, conductive surface provided by anti-arcing layer 202 may prevent many or all such arcing defects from occurring by acting as an electromagnetic interference shielding layer that prevents plasma-induced damage exhibited in arcing defects 122. The anti-arcing layer 202 may prevent the accumulation of electrons in specific locations in the layout of wafer 200 in order to prevent or decrease the number of arcing defects. For example, in some embodiments the use of the anti-arcing layer 202 has decreased the arcing defect rate from around 30-50% to about 0% in some processes. This may increase the yield per wafer during processing of a large number of wafers like wafer 200, relative to the yield per wafer of wafers like wafer 100 of FIGS. 1A, 1B, 1C, 1D, and 1E. In some embodiments of wafer 200, the anti-arcing layer 202 is left on and patterned as necessary to form the intended integrated circuits. However, in other embodiments like that depicted in FIG. 2G, the anti-arcing layer 202 is removed before other processing steps are performed, such as depositing a conductive layer within the opening in the dielectric layer 114, etc.

Figure 3:
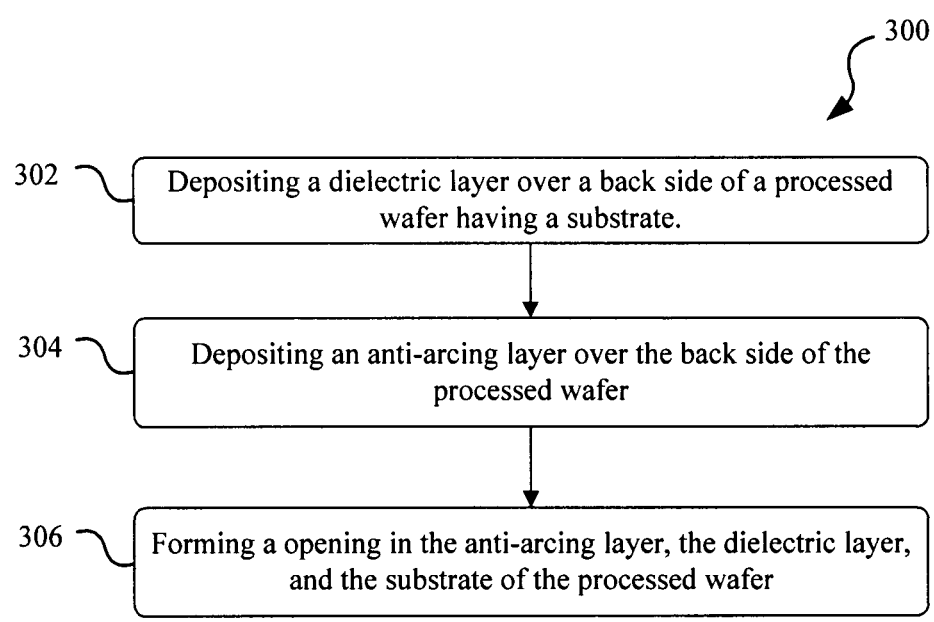
FIG. 3 is a flowchart of a method for preventing arcing during processing of a back side of a semiconductor wafer according to an embodiment of the present disclosure.

FIG. 3 is a flowchart of a method 300 for preventing etch arcing defects during semiconductor processing. The method 300 of the flowchart in FIG. 3 contains a plurality of steps. In some embodiments, additional steps are included in the method. These additional steps may occur before, after, and in between the depicted steps. The method includes a step 302 in which a semiconductor processing tool is used to deposit a dielectric layer over a back side of a processed wafer. The processed wafer may have a plurality of patterned layers deposited on a substrate to form an integrated circuit on a front side thereof. In step 304, the same tool or a different tool is used to deposit an anti-arcing layer over the back side of the processed wafer. After the conductive layer is deposited over the back side of the wafer, one or more etch tools and/or processes are used to form an opening in the anti-arcing layer, the dielectric layer, and the substrate in order to allow a through-wafer interconnect to be formed through the substrate 102.

To better describe method 300, reference will now be made to the wafer 200 as depicted in FIGS. 2A, 2B, 2C, 2D, 2E, 2F, and 2G. For example, the dielectric layer 114 is deposited over the back side of wafer 200 after an opening has been made in the barrier layer 112 and through part of the substrate 102. In some embodiments, this opening may not be formed prior to deposition of the dielectric layer 114. The dielectric layer 114 is an oxide layer formed by a CVD process.

Over the dielectric layer 114, the anti-arcing layer 202 is a tantalum layer deposited by another CVD process. Forming an opening in the anti-arcing layer 202 may be done through a plurality of photolithographic and etching steps. As depicted in FIGS. 2B, 2C, 2D, and 2E a photoresist layer 118 is deposited over the anti-arcing layer 202 and patterned to create an opening. A portion of the anti-arcing layer 202 that is exposed by the formation of the opening in the photoresist layer 118 is removed by a Cl-based dry etch process. This Cl-based dry etch process removed the exposed portion of the anti-arcing layer 202 and in turn exposes a portion of the dielectric layer 114. A second dry etch process, using $CF_4$ as the etchant, is used to remove portions of the dielectric layer 114, the STI structure 116, and ILD layer 104. After these two etch processes, a conductive layer 106 is exposed such that is it accessible to the back side of wafer 200, as seen in FIG. 2E. The photoresist layer 118 may then be removed. Further, in some embodiments the remaining portion of the anti-arcing layer is removed prior to further processing. Such further processing may include the deposition of conductive material to form an interconnect linking the back and front sides of the wafer. In some embodiments, additional etch processes are used to remove the depicted layers or to remove layers that are not depicted in this embodiment, but are included in other embodiments.

Method 300 of FIG. 3 may be used in the production of back-side illuminated image sensors to create back-side pads for electrically coupling the front and back sides of each sensor. However, method 300 may be applied in a wide array of back-side processing situations and should not be understood as limited to back-side illuminated sensor embodiments.

The present disclosure provides for many different embodiments. For example, a semiconductor wafer comprising a substrate is included. The substrate has a front side and a back side, and the back side has a plurality of material layers thereon. The plurality of material layers includes a first material layer over the back side of the substrate and an anti-arcing layer disposed over the first material layer. The anti-arcing layer provides a substantially uniform conductive surface over the first material layer.

In another example, the present disclosure includes a method for preventing arcing during processing of a back side of a semiconductor wafer. The method includes depositing a dielectric layer over the back side and depositing an anti-arcing layer over the dielectric layer. The method further includes etching an opening through a plurality of material layers of the semiconductor wafer to expose a conductive layer located on a front side of the semiconductor wafer. The example further includes a step of depositing a conductive layer in the opening to form a through-wafer interconnect.

Numerous variations may be made to the embodiments discussed herein that may be apparent to one of skill in the art. These variations are considered to be within the scope and spirit of this disclosure.

What is claimed is:

1. A semiconductor wafer, comprising:
   a substrate, the substrate having a front side and a back side;
   at least one circuit element on or above the front side; and
   a plurality of material layers over the back side, wherein the plurality of material layers includes:

a first material layer over the back side of the substrate; and an anti-arcing layer disposed over the first material layer, wherein the anti-arcing layer provides a conductive surface over the first material layer, and the anti-arcing layer is patterned to have at least one opening through the anti-arcing layer.

2. The semiconductor wafer of claim 1, wherein the first material layer is a dielectric layer.

3. The semiconductor wafer of claim 1, wherein the anti-arcing layer is a metal layer.

4. The semiconductor wafer of claim 1, further comprising an opening in the anti-arcing layer, the first material layer, and the substrate such that a front side of the substrate is accessible from the back side.

5. The semiconductor wafer of claim 1, wherein the anti-arcing layer provides a surface with substantially uniform potential across the semiconductor wafer.

6. The semiconductor wafer of claim 1, wherein the anti-arcing layer has a thickness less than about 700 angstroms.

7. The semiconductor wafer of claim 1, wherein the anti-arcing layer includes one of aluminum, aluminum copper alloy, copper, tantalum, titanium, titanium nitride, tungsten, polysilicon, metal silicide, and combinations thereof.

8. The semiconductor wafer of claim 1, further comprising a barrier layer disposed between the back side of the substrate and the first material layer.

9. The semiconductor wafer of claim 8, wherein anti-arcing layer is made from a conductive material and is not a functional conductive layer.

10. A device, comprising:
a substrate, the substrate having a front side and a back side;
at least one circuit element on or above the front side; and
a plurality of material layers over the back side, wherein the plurality of material layers includes:
a non-conductive layer over the back side of the substrate; and
a metal layer disposed over the non-conductive layer, wherein the metal layer provides a conductive surface over the non-conductive layer, the metal layer is patterned to have at least one opening through the metal layer, and the metal layer is not a functional conductive layer.

11. The device of claim 10, wherein the non-conductive layer is a dielectric layer.

12. The device of claim 10, further comprising an opening in the metal layer, the non-conductive layer, and the substrate such that a front side of the substrate is accessible from the back side.

13. The device of claim 10, wherein the conductive surface provided by the metal layer is substantially uniform across the semiconductor wafer.

14. The device of claim 10, wherein the metal layer has a thickness less than about 700 angstroms.

15. The device of claim 10, wherein the metal layer includes one of aluminum, aluminum copper alloy, copper, tantalum, titanium, titanium nitride, tungsten, polysilicon, metal silicide, and combinations thereof.

16. The device of claim 10, further comprising a barrier layer disposed between the back side of the substrate and the non-conductive layer.

17. A semiconductor wafer, comprising:
a semiconductor substrate;
a first conductive layer located on a front side of the semiconductor substrate;
a dielectric layer deposited over a back side of the semiconductor substrate;
a metal layer deposited over the dielectric layer;
a via through at least the metal layer, the dielectric layer, and the semiconductor substrate, the via configured to expose the first conductive layer; and
a second conductive layer deposited in the via to form a through-wafer interconnect.

18. The semiconductor wafer of claim 17, wherein the metal layer is not used for supplying electrical signals or power.

19. The semiconductor wafer of claim 17, wherein the first conductive layer is patterned.

* * * * *